(12) United States Patent
Makihara et al.

(10) Patent No.: US 7,286,018 B2
(45) Date of Patent: Oct. 23, 2007

(54) TRANSISTOR CIRCUIT

(75) Inventors: Hirokazu Makihara, Takatsuki (JP); Kazuki Tateoka, Takatsuki (JP); Katsuhiko Kawashima, Nishinomiya (JP); Shingo Matsuda, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 159 days.

(21) Appl. No.: 11/231,800

(22) Filed: Sep. 22, 2005

(65) Prior Publication Data

US 2006/0081878 A1   Apr. 20, 2006

(30) Foreign Application Priority Data

Oct. 5, 2004   (JP) .............................. 2004-293006

(51) Int. Cl.
   *H03F 3/191*   (2006.01)
(52) U.S. Cl. .................. 330/295; 330/302; 330/307
(58) Field of Classification Search ............... 330/295, 330/302, 307
   See application file for complete search history.

(56) References Cited

U.S. PATENT DOCUMENTS 5,321,279 A   6/1994   Khatibzadeh et al.
6,727,761 B1 *   4/2004   Apel .......................... 330/295
6,784,747 B1 *   8/2004   Zhang et al. .............. 330/295

FOREIGN PATENT DOCUMENTS

JP   08-279561   10/1996

* cited by examiner

*Primary Examiner*—Steven J. Mottola
(74) *Attorney, Agent, or Firm*—McDermott Will & Emery LLP (57) ABSTRACT

The transistor circuit 1 includes a plurality of transistor cells 10 each having a transistor 11, a base ballast resistor 12, a capacitor 13, and an inductor 14. The transistors 11 have the respective collectors commonly connected to a collector terminal 1c of the transistor circuit 1 and the respective emitters commonly connected to an emitter terminal 1e thereof. Each base ballast resistor 12 is connected to bases of the transistor 11 at one end and to a base terminal 1b of the transistor circuit 1 at the other end. The capacitor 13 is serially connected to the inductor 14, thus to form a serial resonant circuit 15, which is connected in parallel with the base ballast resistor 12 and provided between the bases of the transistor 11 and the base terminal 1b of the transistor circuit 1 and connected thereto.

6 Claims, 9 Drawing Sheets

TRANSISTOR CIRCUIT

BACKGROUND OF THE INVENTION

1. Field of the Invention

The present invention relates to a transistor circuit, and more particularly to a transistor circuit which comprises a plurality of transistor cells and is suitable for power amplification of a radio frequency signal.

2. Description of the Background Art

Figure 6:
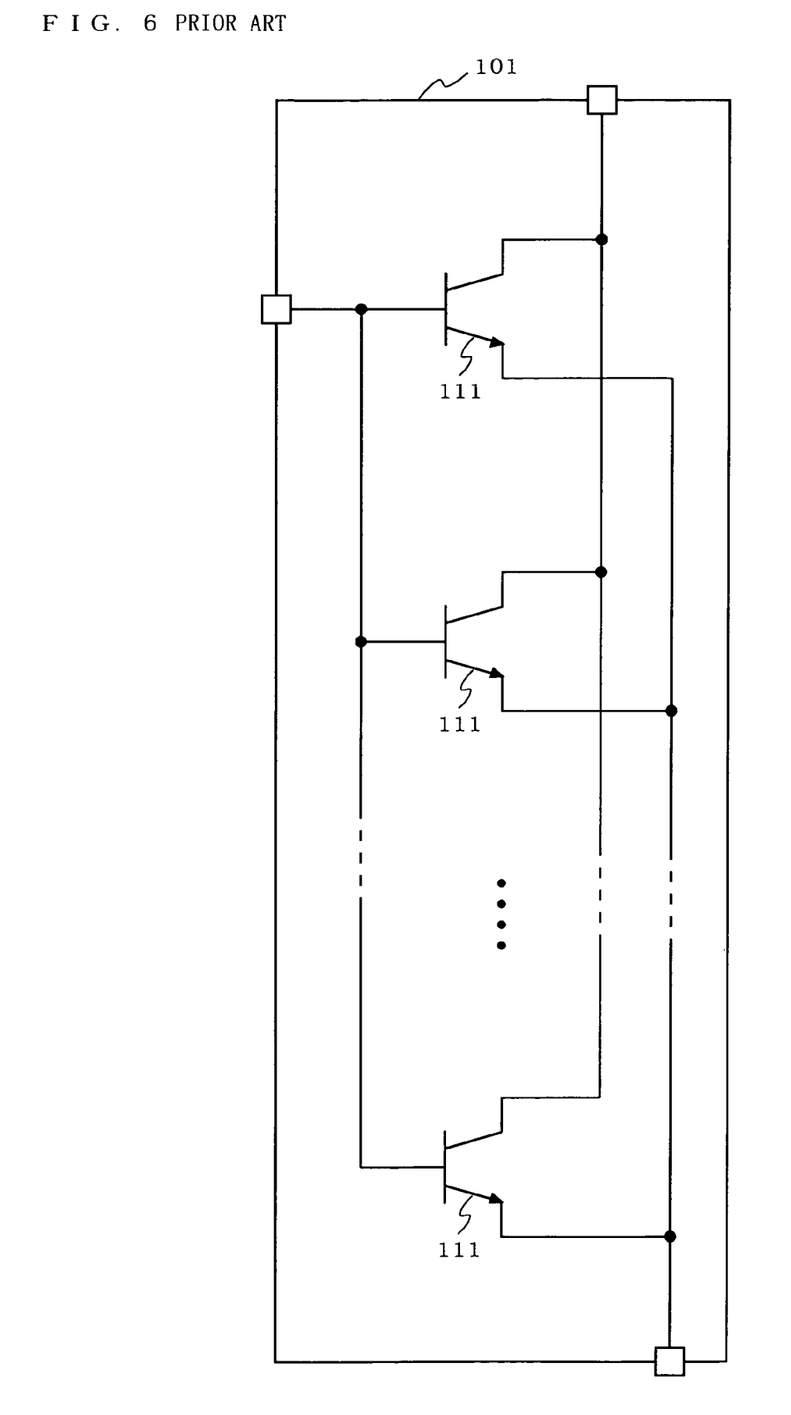
FIG. 6 is a block diagram illustrating a conventional transistor circuit 101.

As is well known, a transistor circuit 101 for radio frequency power amplification is constructed such that a plurality of transistors 111 are connected in parallel with each other so as to keep a radio frequency characteristic, as shown in FIG. 6. In FIG. 6, a DC voltage (bias voltage) and a radio frequency signal are inputted to a base of each transistor 111. An emitter of each transistor 111 is grounded and an output signal of each transistor 111 is output from a collector to which the transistors 111 are commonly connected.

The transistor circuit 101 shown in FIG. 6 is an ideal circuit in the case of assuming that the respective transistors 111 uniformly operate, that is, there are no variations in operation. In practice, however, since there are characteristic variations and the like among the respective transistors 111, a positive feedback that "a temperature rise" causes "an operating current increase", which in turn leads to "an increased temperature rise", is made due to a positive correlation between an operating current and an element temperature which are specific to a transistor, thereby causing a phenomenon of currents concentrating in a certain transistor 111. The phenomenon causes problems that the transistor circuit 101 will have a gain or an efficiency reduced, and, at worst, some transistor 111 will have a high heating value during the operation thereby causing a thermal runaway, which may increase a base current of the transistor 111 thereby causing a device destruction.

Figure 7:
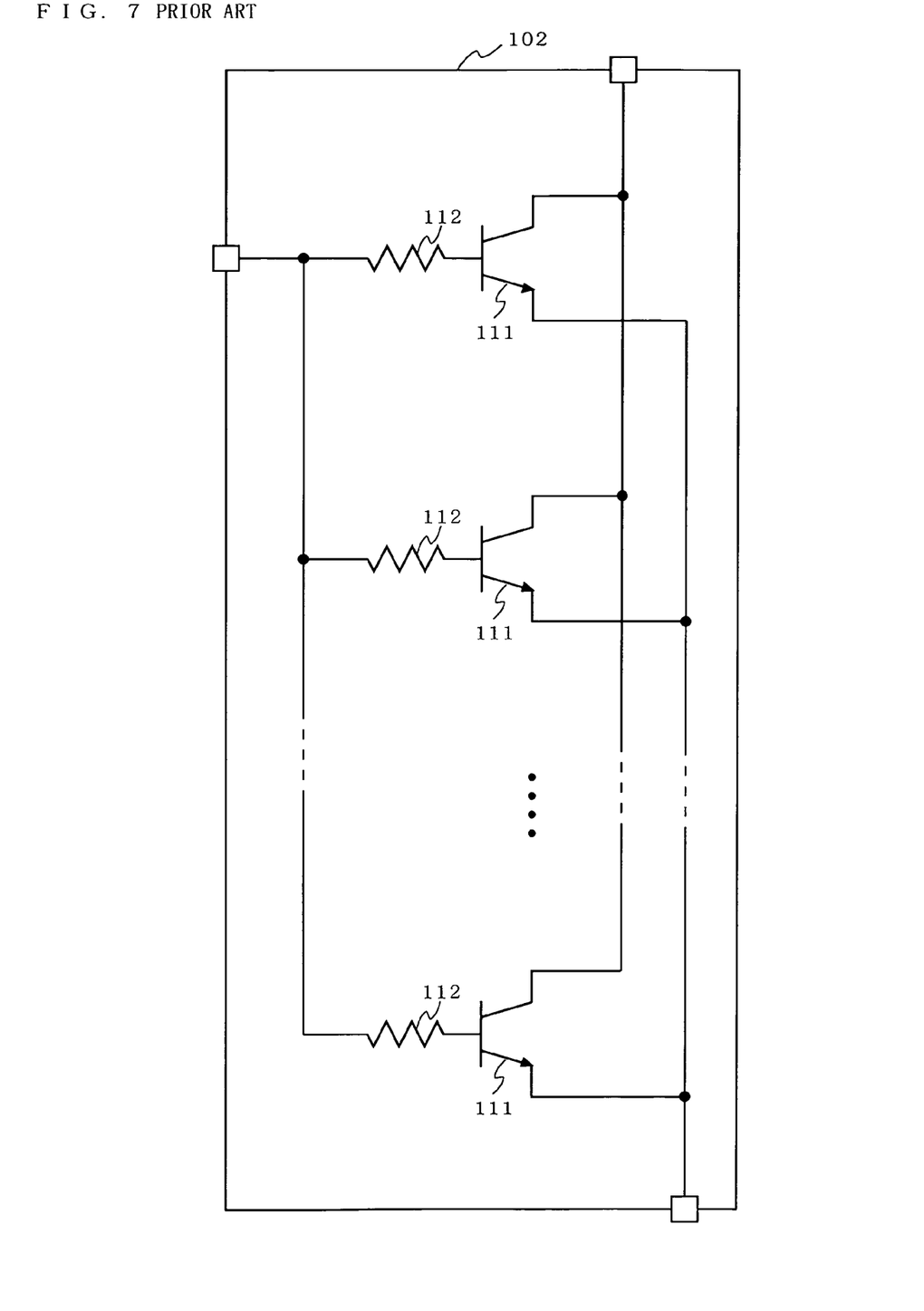
FIG. 7 is a block diagram illustrating a conventional transistor circuit 102.

In order to overcome such problems, a transistor circuit 102 is devised for preventing an increase in base current by providing a base ballast resistor 112 adjacent to the base of the transistor 111, as shown in FIG. 7. In the case of this circuit, however, although a thermal runaway of the transistor 111 is able to be prevented, the base ballast resistor 112 will reduce a radio frequency gain.

Figure 8:
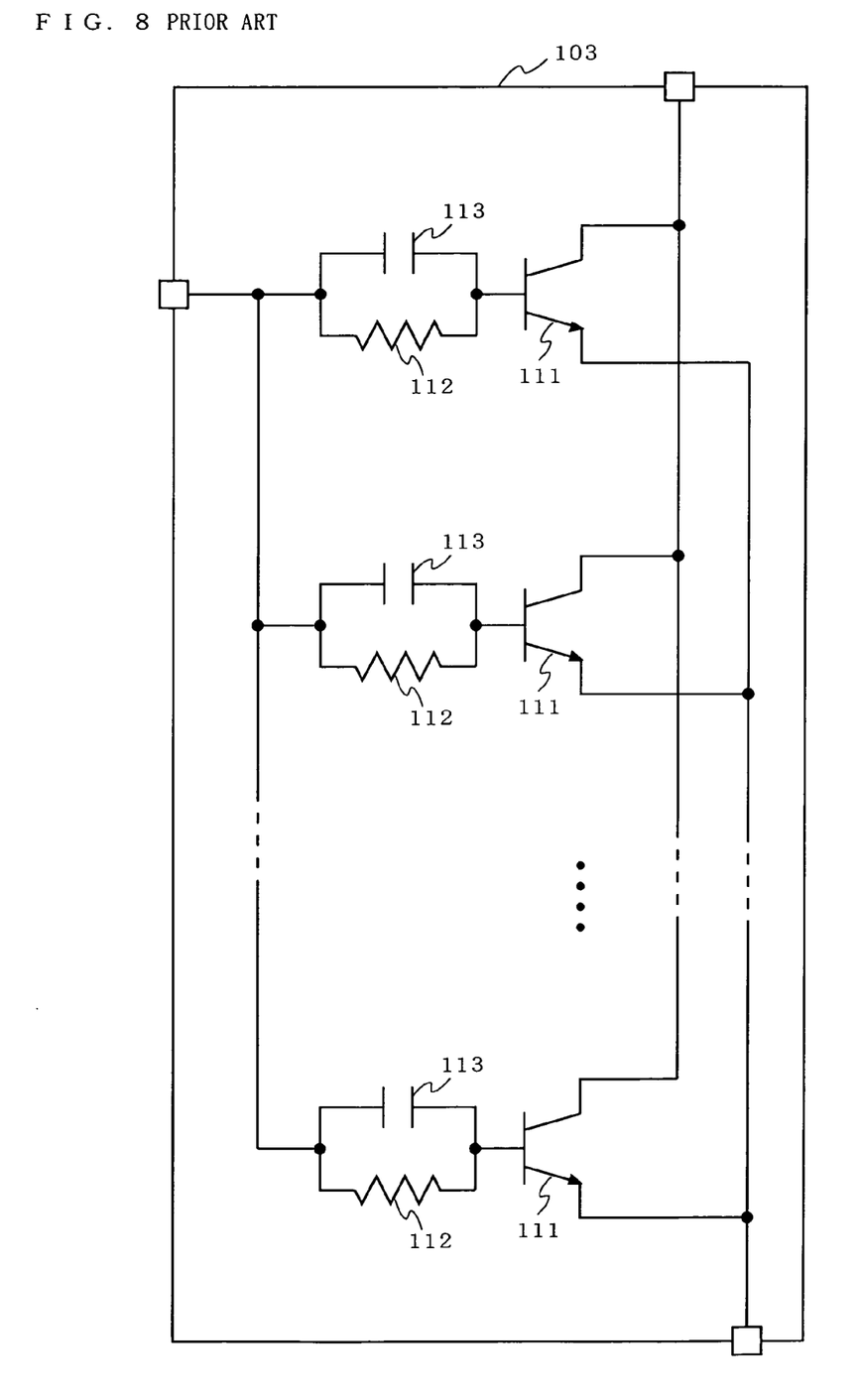
FIG. 8 is a block diagram illustrating a conventional transistor circuit 103.

Therefore, in order to suppress the reduction in radio frequency gain, a transistor circuit 103 is suggested in which a capacitor 113 is connected in parallel with the base ballast resistor 112 as shown in FIG. 8. Such transistor circuit is disclosed in, for example, Japanese Laid-Open Patent Publication No. 8-279561 and the U.S. Pat. No. 5,321,279.

Figure 9:
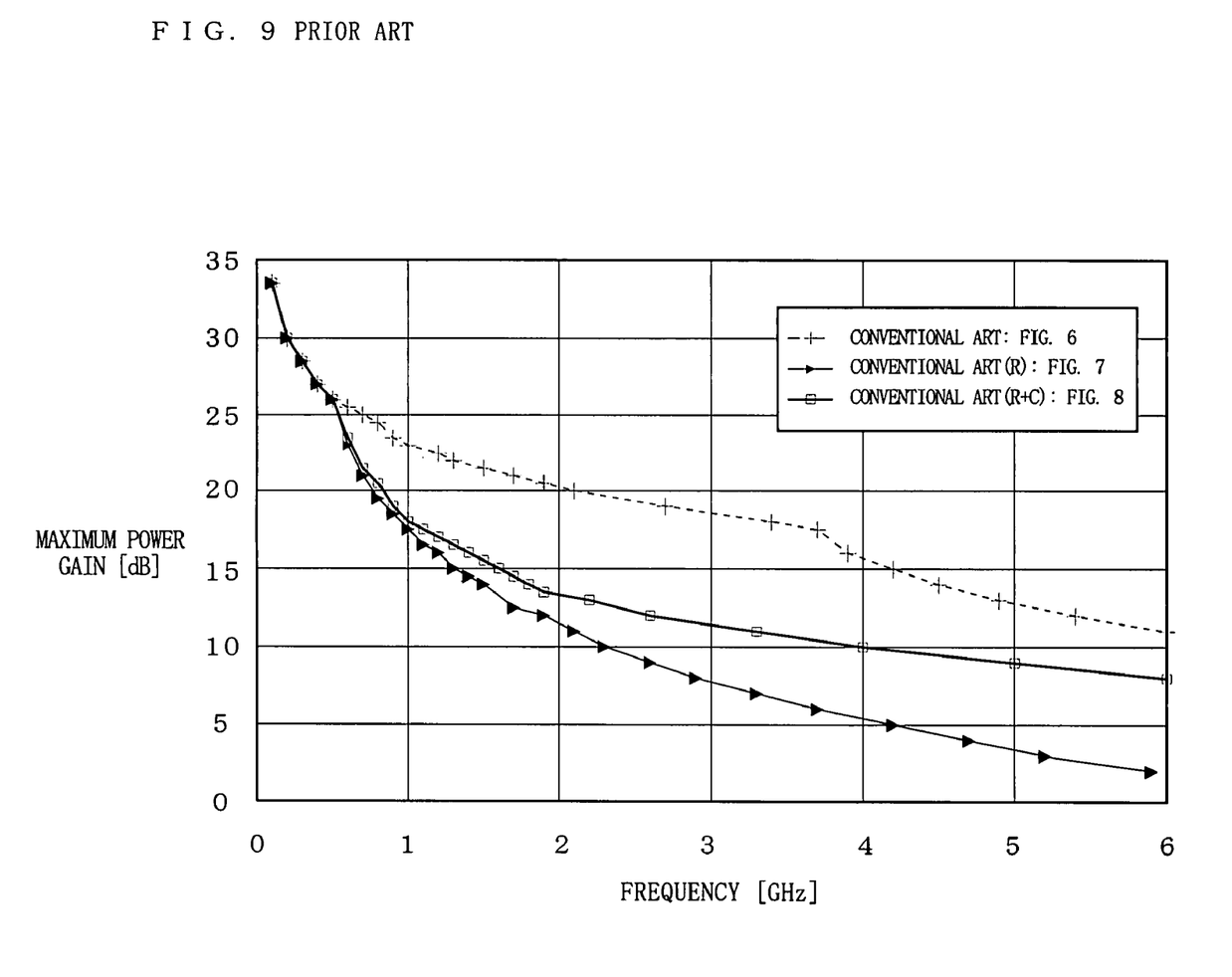
FIG. 9 is a diagram illustrating an example of frequency—maximum power gain characteristic of the conventional transistor circuits 101 to 103.

FIG. 9 shows examples of frequency—maximum power gain characteristic which are obtained by the transistor circuits 101 to 103 shown in FIGS. 6 to 8, respectively. FIG. 9 shows a simulation result obtained when the transistor 111 has an emitter area of 120 μm² and an operating current of 2 mA, and the base ballast resistor 112 has a resistance of 200Ω, and the capacitor 113 has a capacitance of 0.3 pF.

When the configuration is as shown in FIG. 8, an impedance Z is represented by the following equation (1) where the base ballast resistor 112 has a resistance R and the capacitor 113 has a capacitance C:

$$Z = \frac{-R \times j\left(\frac{1}{\omega C}\right)}{R - j\left(\frac{1}{\omega C}\right)} \quad (1)$$

However, in a conventional configuration shown in FIG. 8 in which an impedance Z is represented by the aforementioned equation (1), it is necessary to set $\omega C (=2\pi f C)$ infinite so as to reduce the impedance Z to zero. Here, since a desired frequency f is fixed, a capacitance C may be made infinite in theory. However, it is impossible in practice. Specifically, a capacitance made on a semiconductor substrate cannot have a sufficiently great value due to a limitation on a chip layout.

Therefore, since a radio frequency power signal is inputted to the transistor 111 through not only the capacitor 113 but also the base ballast resistor 112, the base ballast resistor 112 causes a power loss, thereby reducing a radio frequency gain. Further, when a radio frequency signal passes through the capacitor 113, a harmonic component or an out-of-band signal component is not able to be reduced.

SUMMARY OF THE INVENTION

Therefore, an object of the present invention is to provide a transistor circuit which prevents a thermal runaway of a transistor, and is capable of substantially reducing a power gain of an unnecessary harmonic component or an unnecessary out-of-band signal component while suppressing reduction in power gain of a desired frequency component, which is caused by a base ballast resistor.

The present invention is directed to a transistor circuit comprising a plurality of transistor cells. In order to attain the object mentioned above, each of the transistor cells comprising the transistor circuit of the present invention includes a transistor, a base ballast resistor, and a serial resonant circuit.

The transistor has at least one collector finger connected to a collector terminal of the transistor circuit and at least one emitter finger connected to an emitter terminal of the transistor circuit. The base ballast resistor is provided between a base terminal of the transistor circuit and at least one base finger of the transistor and connected thereto. The serial resonant circuit is connected in parallel with the base ballast resistor.

Alternatively, in order to attain the object mentioned above, each of the transistor cells comprising the transistor circuit of the present invention includes a transistor, N base ballast resistors, and N serial resonant circuits.

In this case, the transistor has at least one collector finger connected to a collector terminal of the transistor circuit and at least one emitter finger connected to an emitter terminal of the transistor circuit. N base ballast resistors are provided between a base terminal of the transistor circuit and N base fingers of the transistor, respectively, and connected thereto. N serial resonant circuits are connected in parallel with the N base ballast resistors, respectively.

A preferable serial resonant circuit is constructed such that an inductor is serially connected to a capacitor. The inductor may be shared by two or more transistor cells. Further, as another preferable serial resonant circuit, a serial resonant circuit having one of a microstrip line and a strip line serially connected to the capacitor may be suggested. The microstrip line or the strip line may be shared by two or more transistor cells. Typically, the base ballast resistor and the capacitor are integrated on a semiconductor substrate.

As described above, the transistor circuit of the present invention prevents a thermal runaway of the transistor, and is capable of substantially reducing a power gain of an unnecessary harmonic component or an unnecessary out-of-band signal component while suppressing reduction in power gain of a desired frequency component, which is caused by a base ballast resistor.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
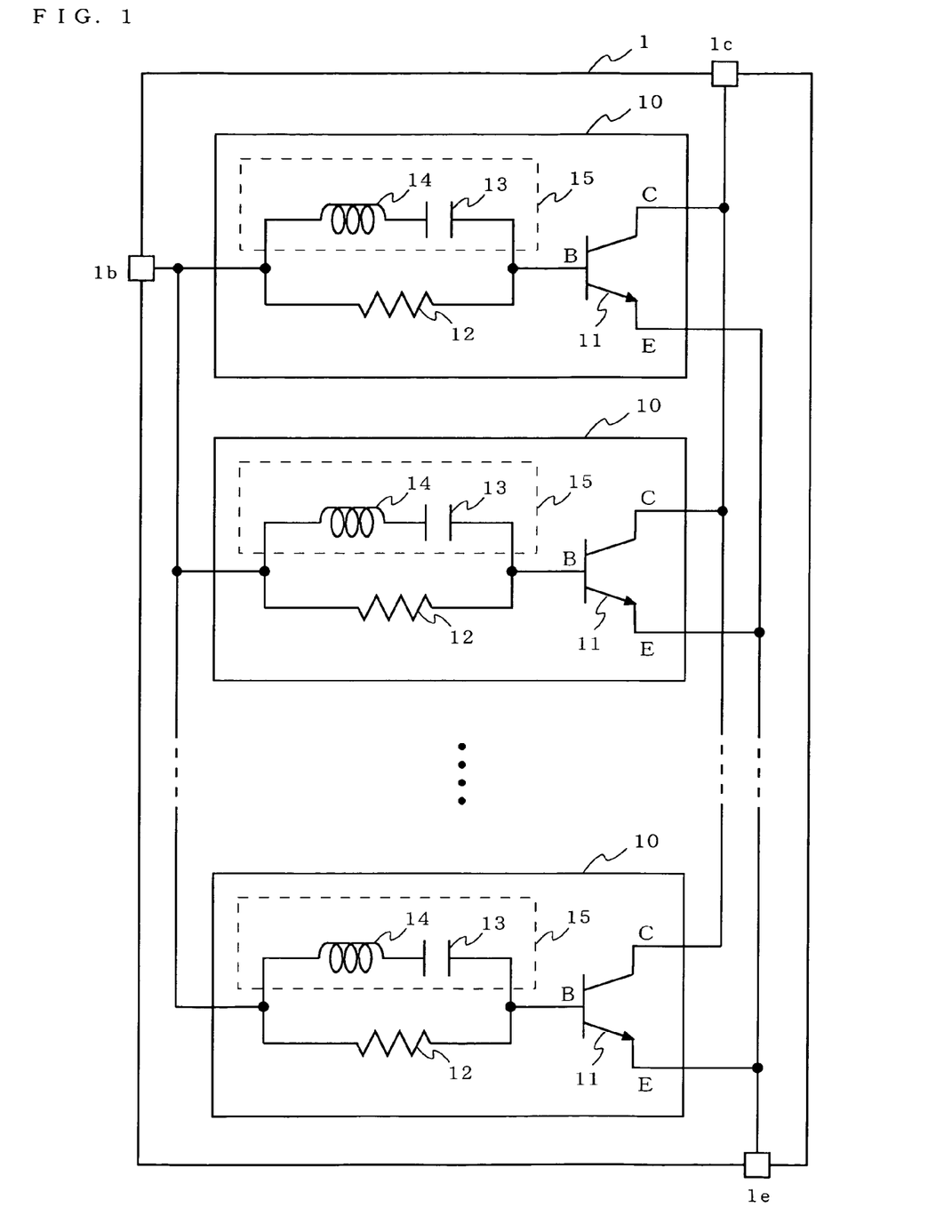
FIG. 1 is a block diagram illustrating a transistor circuit 1 according to one embodiment of the present invention.
Figure 2:
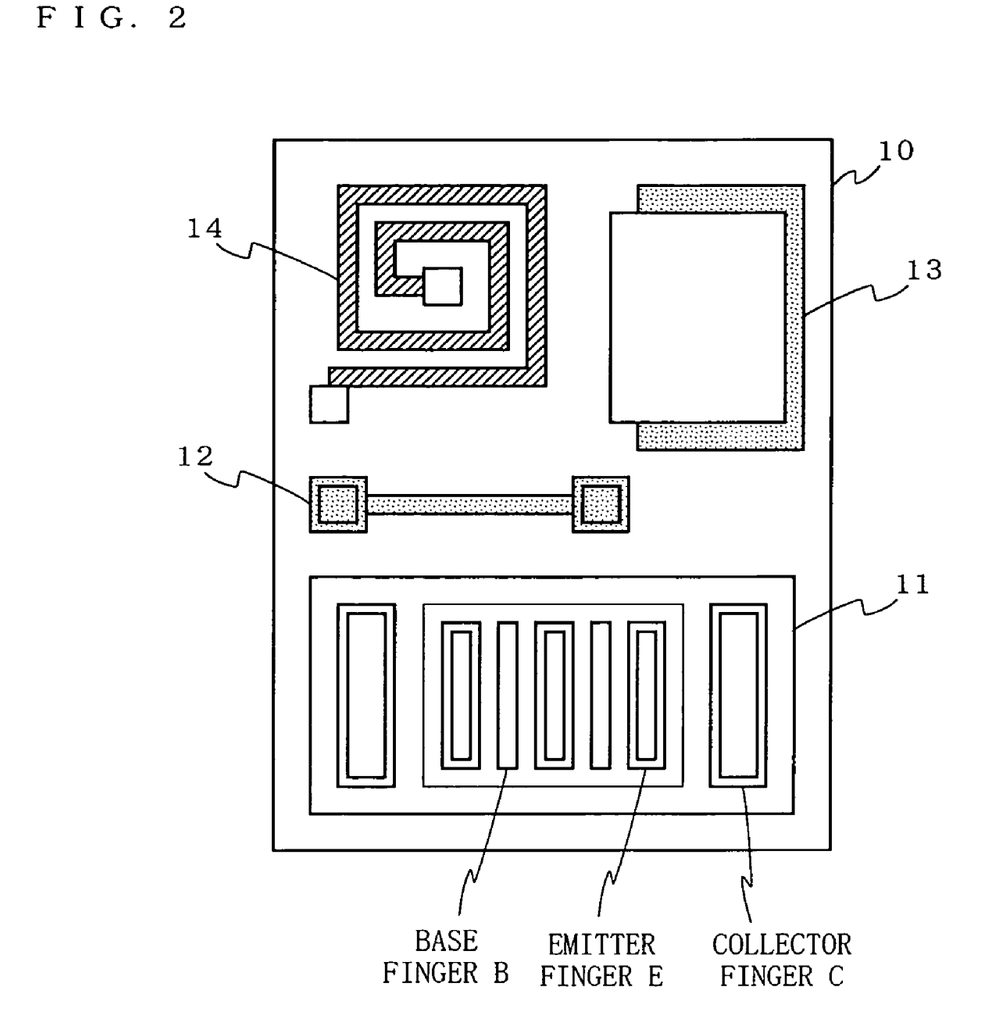
FIG. 2 is a diagram illustrating an example of a typical formation of the transistor circuit 1 according to one embodiment of the present invention.

FIG. 1 is a block diagram illustrating a transistor circuit 1 according to one embodiment of the present invention. In FIG. 1, the transistor circuit 1 of a first embodiment comprises a plurality of transistor cells 10. The transistor cells 10 each includes a transistor 11, a base ballast resistor 12, a capacitor 13, and an inductor 14. As the transistor 11, a bipolar transistor (BT) or a heterojunction bipolar transistor (HBT) is used. As shown in FIG. 2, while the transistor cell 10 is typically constructed such that the respective elements are integrated on a semiconductor substrate, the transistor cell 10 may be constructed such that some elements (for example, inductor 14) are coupled to the semiconductor substrate by means of another component such as a chip component.

Collectors of the respective transistors 11, that is, all the collector fingers C formed on the semiconductor substrate, are connected to a collector terminal $1c$ of the transistor circuit 1. Further, emitters of the respective transistors 11, that is, all the emitter fingers E formed on the semiconductor substrate, are connected to an emitter terminal $1e$ of the transistor circuit 1. One end of the base ballast resistor 12 is connected to a base of the transistor 11, that is, all base fingers B formed on the semiconductor substrate, while the other end thereof is connected to a base terminal $1b$ of the transistor circuit 1. The capacitor 13 is serially connected to the inductor 14, thus to form a serial resonant circuit 15. The serial resonant circuit 15 is provided between the base fingers B of the transistor 11 and the base terminal $1b$ of the transistor circuit 1 so as to be connected in parallel with the base ballast resistor 12.

An impedance Z for this construction is represented by the following equation (2) where the base ballast resistor 12 has a resistance R, the capacitor 13 has a capacitance C, and the inductor 14 has an inductance L:

$$Z = \frac{R \times j\left(\omega L - \frac{1}{\omega C}\right)}{R + j\left(\omega L - \frac{1}{\omega C}\right)} \quad (2)$$

In this equation (2), when $\omega L - (1/\omega C)$ is 0, the impedance Z can be reduced to 0. Therefore, values of L and C may be set such that a frequency f in the following equation (3) is a desired frequency at which a lowest power loss is enabled. This means that the desired frequency is made identical to a resonant frequency of the serial resonant circuit 15.

$$f = \frac{1}{2\pi \sqrt{LC}} \quad (3)$$

Thus, when values of L and C are appropriately set, a DC bias current supplied from the base terminal $1b$ is inputted to the base fingers B of the transistor 11 through the base ballast resistor 12 as in the case of a conventional circuit. A signal component of a desired frequency among radio frequency signals supplied from the base terminal $1b$ is inputted with low-loss to the base fingers B of the transistor 11 through the serial resonant circuit 15, while the other signal components, that is, signal components having frequencies other than the desired frequency, are attenuated in the base ballast resistor 12 and then inputted to the base fingers B of the transistor 11.

Figure 3:
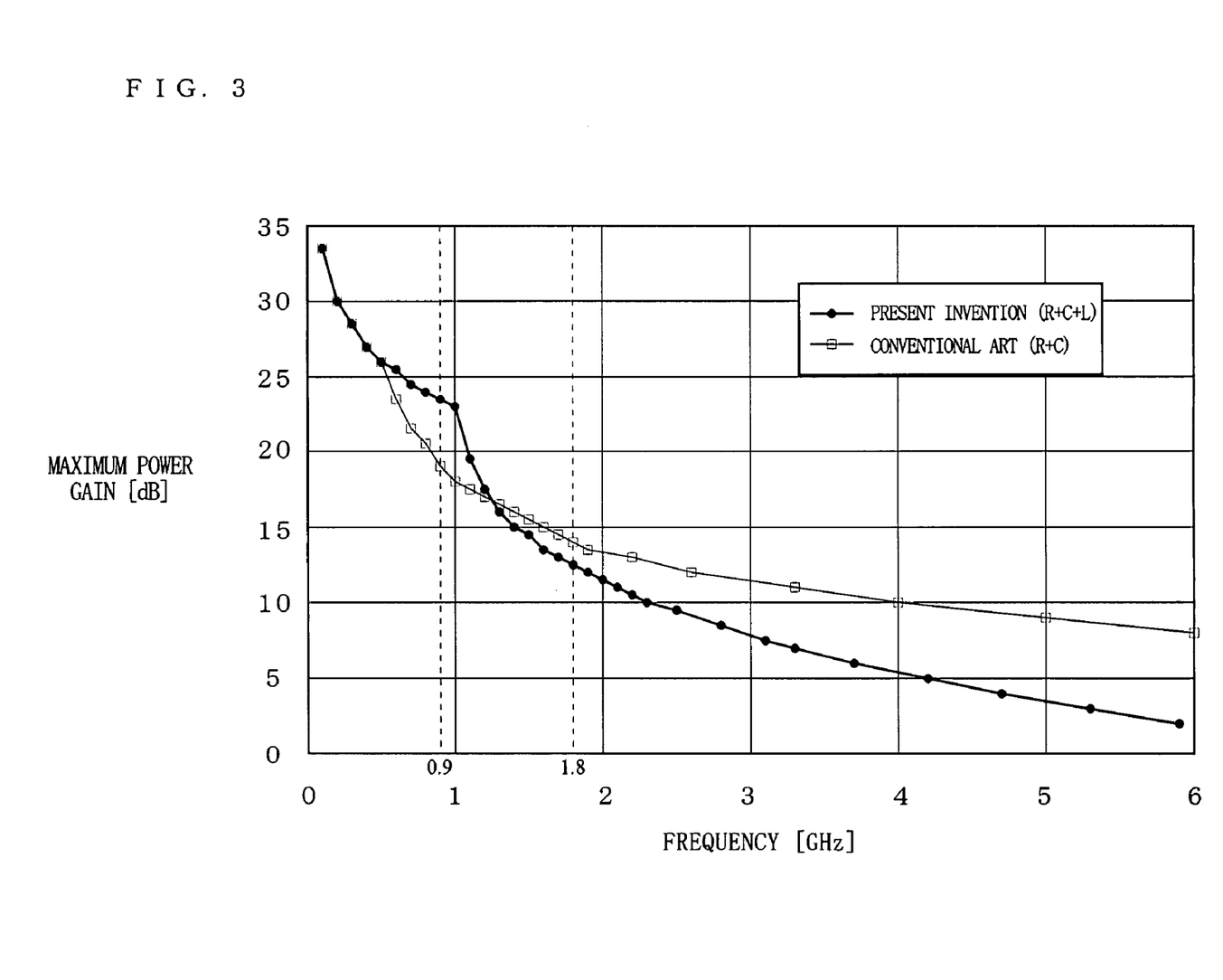
FIG. 3 is a diagram illustrating an example of a frequency—maximum power gain characteristic of the transistor circuit 1 according to one embodiment of the present invention.

FIG. 3 shows an example of a frequency—maximum power gain characteristic of the transistor circuit 1 according to the present embodiment, which is compared with the same characteristic as the aforementioned conventional transistor circuit 103 shown in FIG. 8 has. FIG. 3 shows a simulation result of the transistor circuit 1 which is obtained in a case where a desired frequency is set to 0.9 GHz and 60 transistor cells 10 each of which includes the transistor 11 having an emitter area of 120 $\mu m^2$ and an operating current of 2 mA, the base ballast resistor 12 having a resistance of 200Ω, the capacitor 13 having a capacitance of 0.3 pF, and the inductor 14 having an inductance of 90 nH, are connected in parallel with each other with the emitters being grounded.

As can be seen in FIG. 3, the transistor circuit 1 of the present invention enables a gain to increase by about 4.6 dB at a desired frequency of 0.9 GHz, and a gain to reduce by about 1.4 dB at a frequency of 1.8 GHz corresponding to a second harmonic of a frequency of 0.9 GHz, as compared to a conventional transistor circuit 103.

As described above, the transistor circuit 1 according to one embodiment of the present invention prevents a thermal runaway of the transistor and is able to substantially reduce a power gain of an unnecessary harmonic component or an unnecessary out-of-band signal component while suppressing reduction in power gain of a desired frequency component, which is caused by the base ballast resistor.

Even when the serial resonant circuit 15 has the order of connection between the capacitor 13 and the inductor 14, which is reverse of the connection order shown in FIG. 1, the same effect can be achieved.

Figure 4:
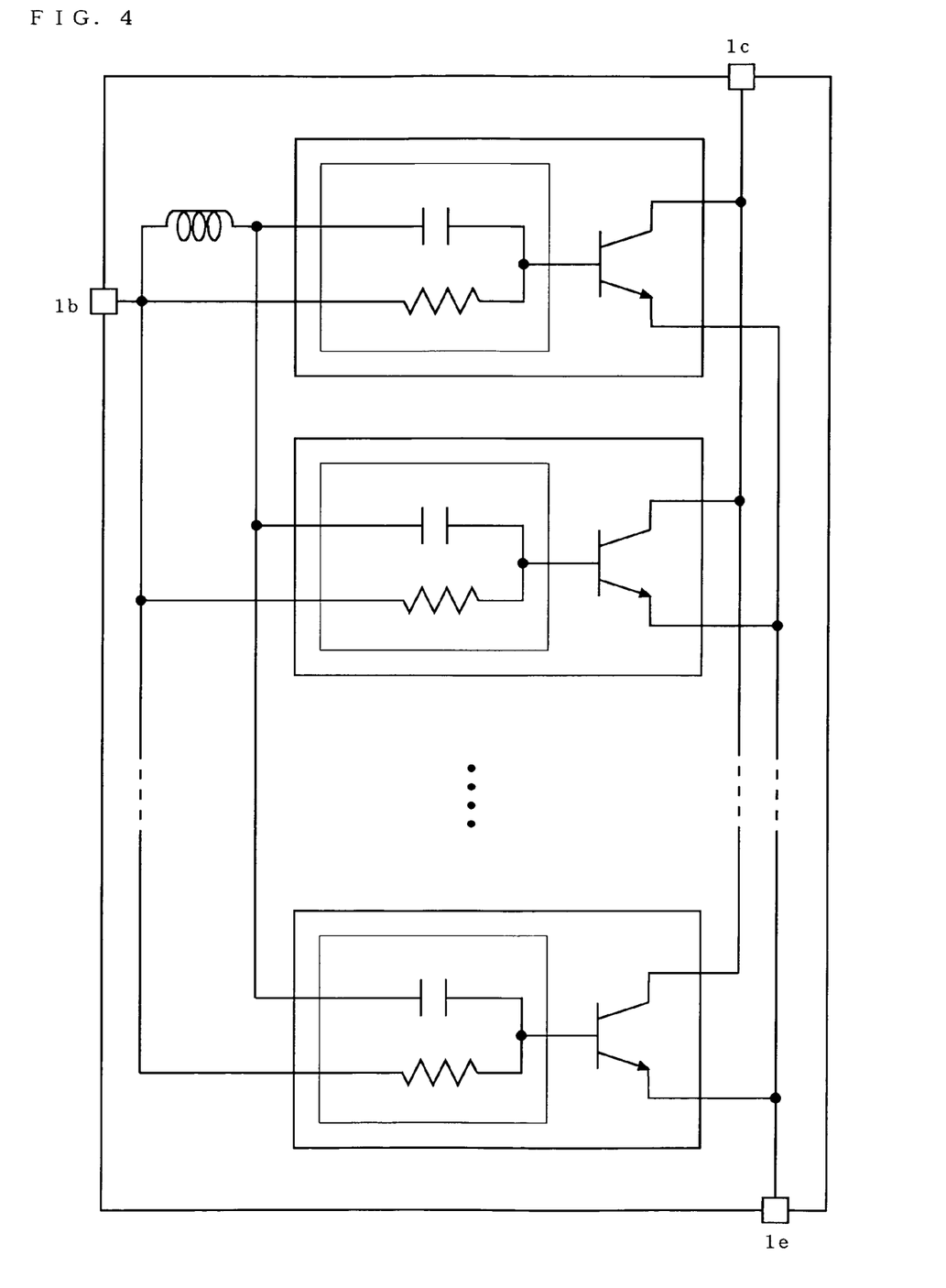
FIG. 4 is a block diagram illustrating another application of the transistor circuit 1 according to one embodiment of the present invention.

Further, in the connection order as shown in FIG. 1, the respective serial resonant circuits 15 may share one inductor which serves as the respective inductors 14. FIG. 4 is a diagram illustrating an example of a transistor circuit of such a configuration. This configuration enables an inductor area to be substantially reduced. For example, when the transistor circuit of the configuration shown in FIG. 4 is used as the transistor circuit of the configuration shown in FIG. 1 in which 60 transistor cells each uses an inductor of 90 nH as described above, the inductor is required to have an inductance of only 1.5 nH, which is one-sixtieth of 90 nH.

Further, also when the inductor 14 is replaced with a strip line or a microstrip line formed on the semiconductor substrate, the same effect can be achieved.

Figure 5:
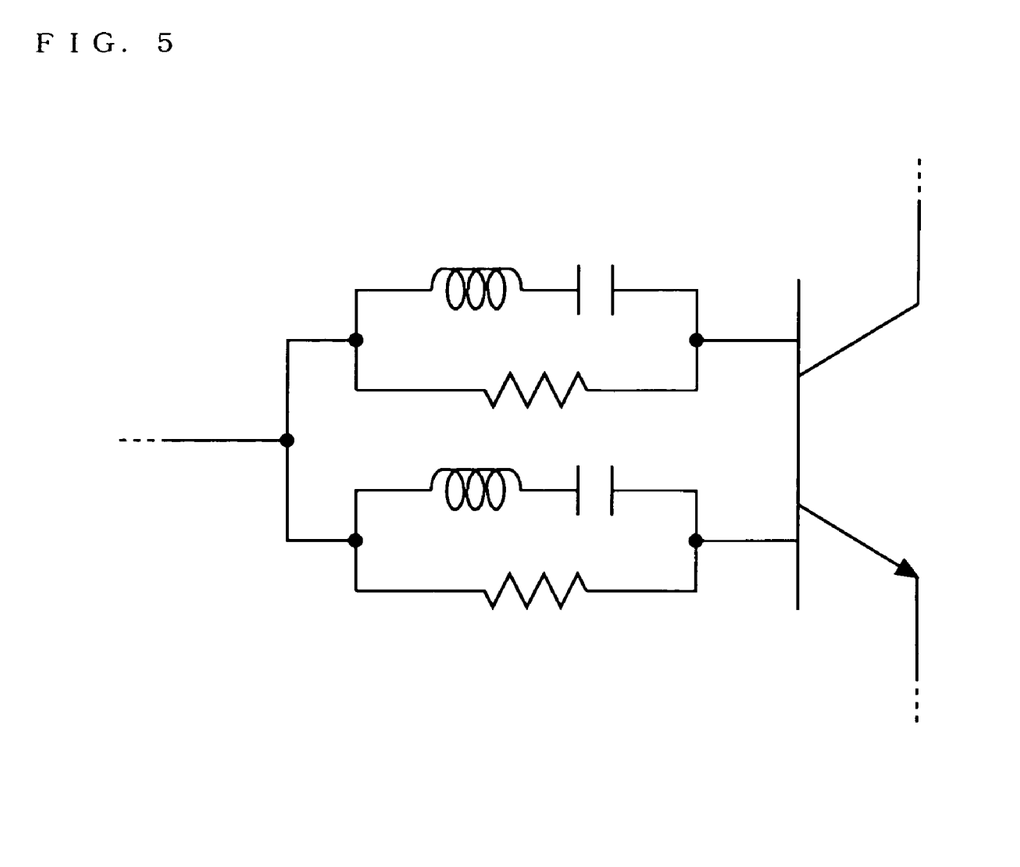
FIG. 5 is a block diagram illustrating another application of the transistor circuit 1 according to one embodiment of the present invention.

Moreover, described in the present embodiment is an example where the transistor 11 has all the base fingers B connected to one serial resonant circuit 15 and one base ballast resistor 12. As shown in FIG. 5, however, each of the plurality of base fingers B may be connected to one serial resonant circuit and one base ballast resistor. In this case, a configuration shown in FIG. 5 may be used as a transistor cell to form a transistor circuit comprising the plurality of transistor cells. Alternatively, the configuration shown in FIG. 5 may be used as a transistor circuit.

While the invention has been described in detail, the foregoing description is in all aspects illustrative and not restrictive. It is understood that numerous other modifications and variations can be devised without departing from the scope of the invention.

What is claimed is:

1. A transistor circuit comprising a plurality of transistor cells, wherein each of the transistor cells includes:
   a transistor having at least one collector finger connected to a collector terminal of the transistor circuit and having at least one emitter finger connected to an emitter terminal of the transistor circuit,
   a base ballast resistor provided between a base terminal of the transistor circuit and at least one base finger of the transistor, the base ballast resistor connected thereto; and
   a serial resonant circuit connected in parallel with the base ballast resistor,
   wherein the serial resonant circuit is constructed such that one of a microstrip line and a strip line is serially connected to a capacitor.

2. A transistor circuit comprising a plurality of transistor cells, wherein each of the transistor cells includes:
   a transistor having at least one collector finger connected to a collector terminal of the transistor circuit and having at least one emitter finger connected to an emitter terminal of the transistor circuit,
   N base ballast resistors provided between a base terminal of the transistor circuit and N base fingers of the transistor, respectively, the N base ballast resistors connected thereto; and
   N serial resonant circuits connected in parallel with the N base ballast resistors, respectively,
   wherein the serial resonant circuit is constructed such that one of a microstrip line and a strip line is serially connected to a capacitor.

3. The transistor circuit according to claim 1, wherein the microstrip line or the strip line is shared by the two or more transistor cells.

4. The transistor circuit according to claim 2, wherein the microstrip line or the strip line is shared by the two or more transistor cells.

5. The transistor circuit according to claim 1, wherein at least the base ballast resistor and the capacitor are integrated on a semiconductor substrate.

6. The transistor circuit according to claim 2, wherein at least the base ballast resistor and the capacitor are integrated on a semiconductor substrate.

\* \* \* \* \*